United States Patent [19]
Ha

[11] Patent Number: 6,069,785
[45] Date of Patent: May 30, 2000

[54] METHOD FOR RESTORING AN ELECTROSTATIC CHUCK FORCE

[75] Inventor: Jae-Hee Ha, Chungcheongbuk-do, Rep. of Korea

[73] Assignee: LG Semicon Co., Ltd., Cheongju, Rep. of Korea

[21] Appl. No.: 08/960,696

[22] Filed: Oct. 29, 1997

[30] Foreign Application Priority Data

Dec. 26, 1996 [KR] Rep. of Korea ................. 96-72198

[51] Int. Cl.$^7$ .................................................. H02N 13/00
[52] U.S. Cl. ...................... 361/234; 361/212; 279/128
[58] Field of Search ................................. 361/212, 213, 361/220, 225, 229, 230–235

[56] References Cited

U.S. PATENT DOCUMENTS

| | | | |
|---|---|---|---|
| 5,378,311 | 1/1995 | Nagayama et al. | 156/643 |
| 5,507,874 | 4/1996 | Su et al. | 134/1 |
| 5,573,981 | 11/1996 | Sato | 437/225 |
| 5,585,012 | 12/1996 | Wu et al. | 216/71 |
| 5,681,424 | 10/1997 | Saito et al. | 156/643.1 |
| 5,746,928 | 5/1998 | Yen et al. | 216/37 |

FOREIGN PATENT DOCUMENTS 6-275581  9/1994  Japan .

*Primary Examiner*—Fritz Fleming
*Attorney, Agent, or Firm*—Fleshner & Kim, LLP

[57] ABSTRACT

A method for restoring an electrostatic chuck force of an electrostatic chuck in a plasma apparatus includes the steps of only supplying a source gas, and applying a source power, but not an RF bias, to the plasma apparatus to induce a positive plasma. The positive plasma discharges any accumulated negative charge on the electrostatic chuck.

17 Claims, 3 Drawing Sheets

FIG.3

| | He FLOW | before RF scan | at start of RF scan | after RF scan | at finish of RF scan |
|---|---|---|---|---|---|
| fabrication w/o discharge | | | | | |
| 1 | 9~10 | 753 | 752 | 739 | 743 |
| 2 | 9~10 | 753 | 723 | 736 | 742 |
| 3 | 9~10 | 753 | 690 | 731 | 735 |
| 4 | 9~68 | 753 | 673 | 710 | 142 |
| after 20 sec. discharge :10mT/100 O2/500WTCP/20 sec | | | | | |
| 5 | 9~10 | 753 | 686 | 720 | 735 |
| 6 | 9~10 | 753 | 673 | 727 | 731 |
| after 60 sec. discharge :10mT/100 O2/500WTCP/60 sec | | | | | |
| 7 | 9~10 | 753 | 711 | 730 | 739 |
| 8 | 9~10 | 753 | 690 | 720 | 734 |
| 9 | 9~10 | 753 | 681 | 725 | 733 |
| 10 | 9~10 | 753 | 676 | 720 | 731 |
| 11 | 9~10 | 753 | 671 | 718 | 729 |
| after 120 sec. discharge :10mT/100 O2/500WTCP/120 sec | | | | | |
| | 9~10 | 753 | 704 | 731 | 735 |
| | 9~10 | 753 | 681 | 728 | 732 |

METHOD FOR RESTORING AN ELECTROSTATIC CHUCK FORCE

BACKGROUND OF THE INVENTION

1. Field of the Invention

The present invention relates to methods of controlling an electrostatic chuck used in the fabrication of semiconductors, and more particularly, to methods for restoring an electrostatic chuck force of an electrostatic chuck.

2. Background of the Related Art

In general, mechanical clamps have been used for holding a wafer in semiconductor fabricating equipment. However, it is a current trend to use an electrostatic chuck, which provides greater process uniformity. Use of electrostatic chucks has been sharply increasing, particularly for high density plasma etching and deposition processes. However, the electrostatic chuck has a problem in that the deposition of particles and polymers on the chuck, which occurs during use of the chuck, causes a back side Helium(He) flow. In addition, charges can accumulate on the chuck when a large Radio Frequency (RF) bias power is applied to a wafer during processing, or during a prolonged series of process steps. The accumulated charge reduces the chuck's electrostatic holding force during subsequent process steps. Though the back side He flow can be eliminated by periodic cleaning of the chuck, it is difficult to eliminate the charge buildup that occurs as process steps are performed.

A conventional electrostatic chuck will be explained with reference to FIG. 1. The conventional electrostatic chuck includes a base plate 2, a ceramic plate 3 and an aluminum plate 4 disposed in succession under a chuck 11 with a focus ring 1. The chuck also includes a power source 9 for inducing a chucking voltage in the chuck 11 and a filter 8 connected between the power source 9 and the chuck 11. A Radio Frequency (RF) generating part 7, a RF matching circuit network 6 and a RF rod 5 are connected in series for supplying RF power to the chuck 11. The chuck 11, base plate 2, ceramic plate 3 and aluminum plate 4 are included in a puck part 10.

As has been explained, the conventional electrostatic chuck may have a significant problem with high back side He flow and charge accumulation. These problems impede restoration of a sufficient chuck force in subsequent process steps. To cope with this problem, either the reaction chamber of the processing equipment is vented to clean the chuck 11 between processing steps, or the polarity of the chuck 11 is manually changed to remove accumulated charges. The venting step, or the polarity reversal step, however, make the fabrication process more expensive and time consuming. Also, automatically or manually performing a polarity reversal step causes trouble in the fabrication process due to modification of the plasma apparatus, and an attempt to manually remove the charge cannot completely remove charges in the chuck.

To summarize, the conventional methods for restoring an electrostatic chuck force have various problems. For example, venting the reaction chamber to clean the chuck between fabricating process steps causes losses of time and money. Further, changing the electrode polarities of the electrostatic chuck cannot completely discharge an accumulated charge, and it requires partly modifying the apparatus.

SUMMARY OF THE INVENTION

Accordingly, the present invention is directed to a method for restoring an electrostatic chuck force that substantially obviates one or more of the above-described problems.

An object of the present invention is to provide a method for restoring an electrostatic chuck force which readily discharges the chuck without any substantial loss in time or money.

To achieve these and other objects and advantages of the invention, a method for restoring an electrostatic chuck force of an electrostatic chuck includes a step of only supplying a source gas and only applying source power to the plasma apparatus without applying an RF bias to induce a positive plasma, thereby discharging in the electrostatic chuck.

Another method embodying, the invention for discharging an accumulated charge from an electrostatic chuck may include the steps of removing an RF bias from the electrostatic chuck and applying a source power to the electrostatic chuck to discharge the accumulated charge.

A method embodying the invention for fabricating a semiconductor device in a plasma apparatus may include the steps of holding a substrate in the plasma apparatus with an electrostatic chuck, performing a process step on the substrate, applying a source power to the electrostatic chuck while no RF bias is applied to discharge an accumulated charge, and performing a subsequent processing step after the accumulated charge has been discharged.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
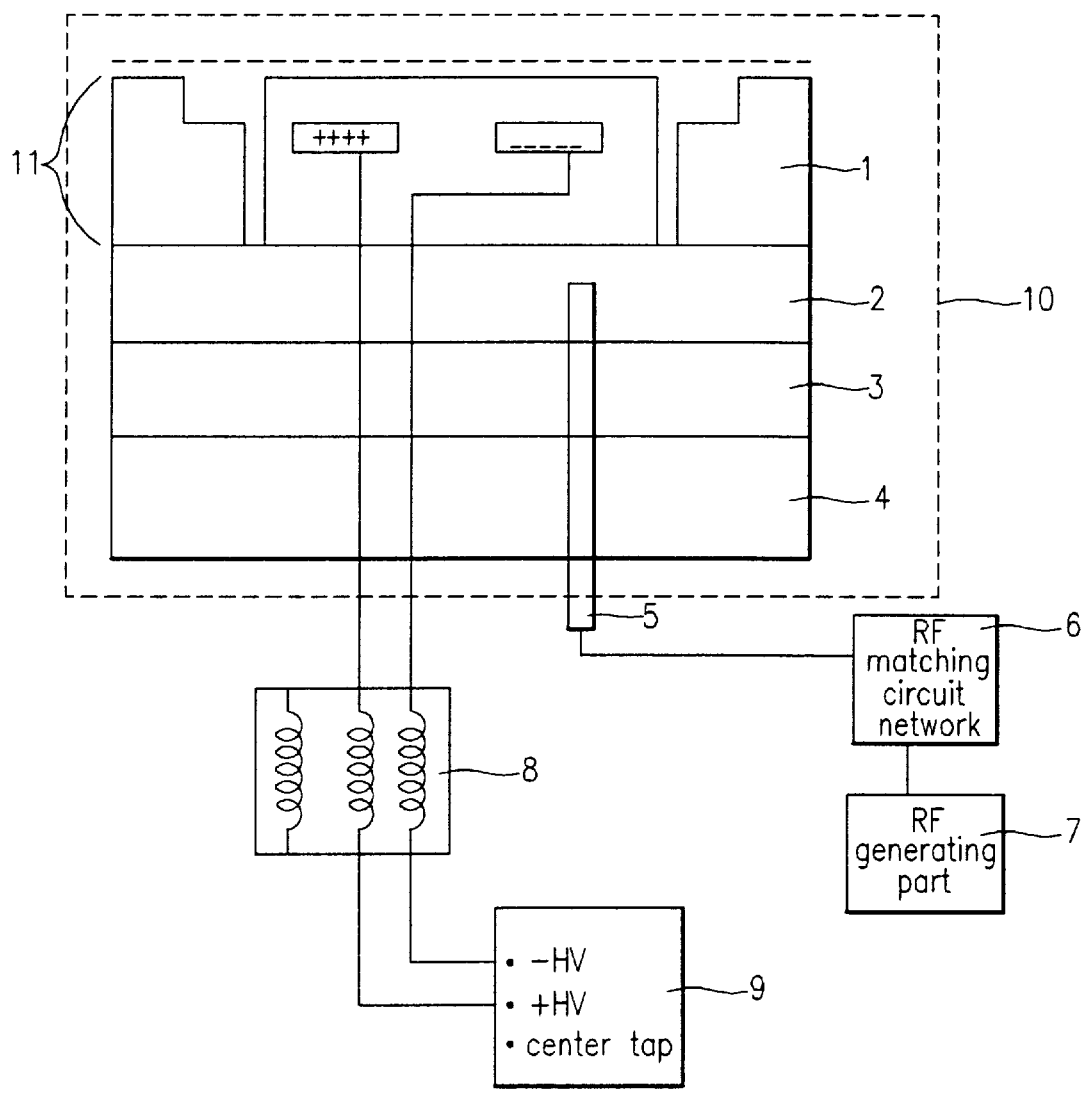
FIG. 1 illustrates a related art electrostatic chuck.
Figure 2:
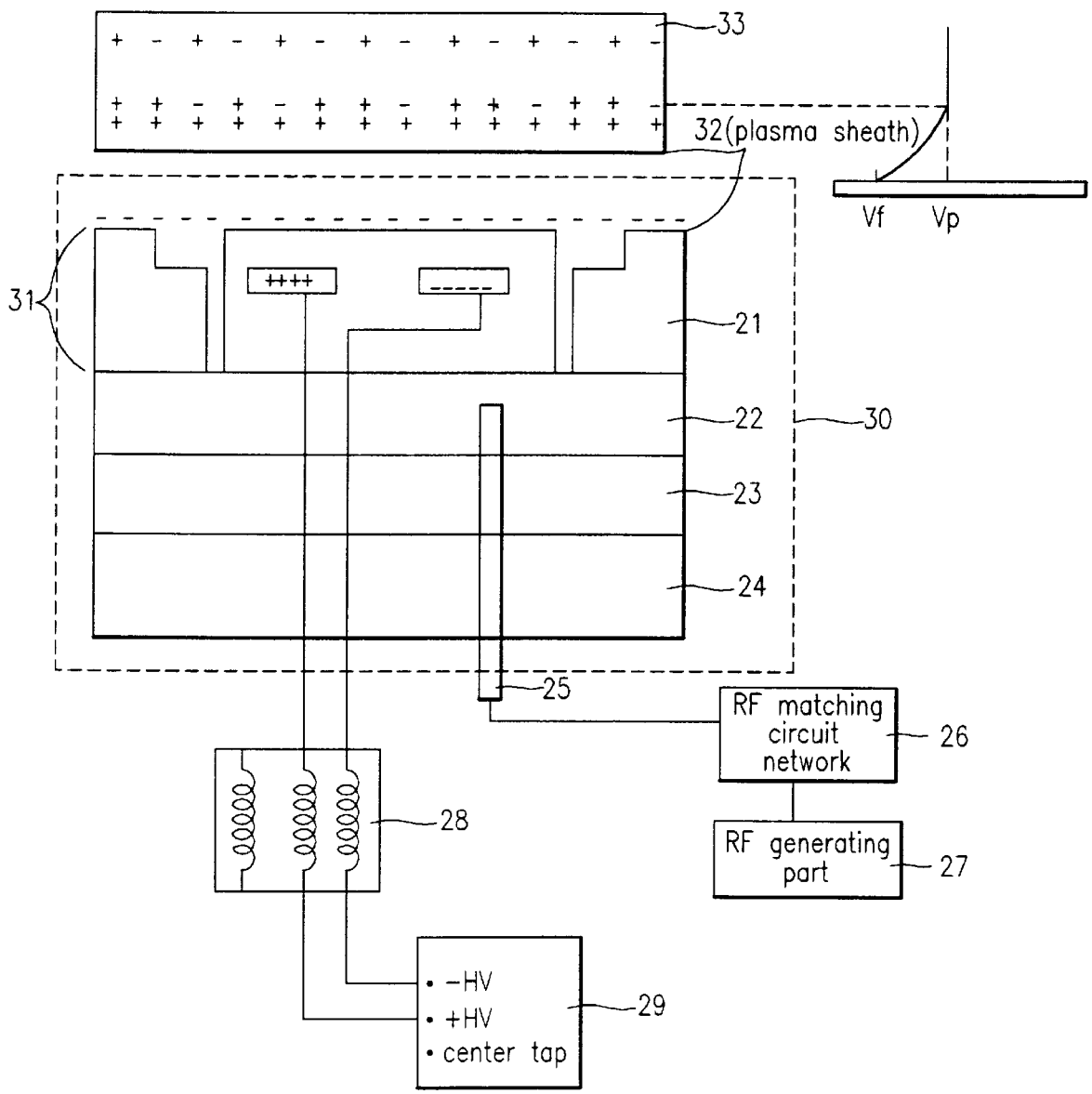
FIG. 2 illustrates an electrostatic chuck for explaining a method for restoring an electrostatic chuck force embodying the present invention; and, FIG. 3 shows a cable of experimental data from application of a method for restoring an electrostatic chuck force embodying the present invention.

Referring to FIG. 2., the electrostatic chuck includes a base plate 22, a ceramic plate 23 and an aluminum plate 24 disposed in succession under a chuck 31 with a focus ring 21. The electrostatic chuck also includes a power source 29 for applying a source power to induce a chucking voltage in the chuck 31, and a filter 28 between the power source 29 and the chuck 31. The electrostatic chuck further includes a RF generating part 27, a RF matching circuit network 26 and a RF rod 25, connected in series, for supplying RF bias power to the chuck 31. When plasma is generated to restore an electrostatic chuck force in accordance with a method embodying the present invention, a region around the chuck 31 in which the plasma is formed is defined as a bulk plasma region 33, and a region between the bulk plasma region 33 and the chuck 31 is defined as a plasma sheath 32. The chuck 31, base plate 22, ceramic plate 23 and aluminum plate 24 are included in a puck part 30.

In a method embodying the invention, first, a gas used in a processing step such as an inert gas, a gas for removing a polymer, or a gas which does not affect the fabrication process, is supplied to a top of the chuck 31. Then, the RF bias power is turned off, while the source power from the power source 29 remains on. As a result, a positive plasma (Vp>0) is formed in the bulk plasma region 33, which comes in contact with negative charges that may have accumulated in the chuck.

The positive plasma substantially eliminates, or greatly reduces any accumulated negative charges in the chuck 31 to the bulk plasma region 33. Once the accumulated negative charge is eliminated, the chucking force of the electrostatic chuck is restored, allowing the chuck to securely hold a wafer in a subsequent process step. Thus, a method embodying the invention for restoring an electrostatic chucking force is applicable to all electrostatic chuck apparatus which can control the source power and the bias power, independently. A method embodying the present invention is advantageous in that charges accumulated in the electrostatic chuck can be discharged within a time period significantly shorter than a main process time period without modification of the apparatus.

FIG. 3 shows a table of results from application of a method embodying the present invention. The table shows electrostatic chucking voltage before and after process steps have been performed on a semiconductor wafer. In particular, the table shows whether the chucking voltage before application of RF bias power can be restored after a process step, by conducting a discharging method of the present invention.

Referring to FIG. 3, prior to a first process step, a voltage of 753 V is applied to a wafer, on which helium is flowing, before application of the RF bias power. If the RF power is continuously applied to the wafer without discharging the chuck, a high rate of helium flow is caused and the chucking voltage drops to a 142 V after four process steps. At such a low chucking voltage, it is difficult to hold a wafer due to the low electrostatic force generated by the low voltage.

After the fourth process step, an accumulated charge in the chuck is discharged under a 10 m torr pressure, in a flow of oxygen at about 100 sccm, and in a 500 watt transformer coupled plasma state for 20 seconds. After the discharging step, the electrostatic chucking voltage is restored. Accordingly, holding a wafer in the next wafer fabricating process step becomes much easier.

The discharging step according to the invention is again performed between the sixth and seventh process steps under a 10 m torr pressure, in a flow of oxygen at about 100 sccm, and in a 500 watt transformer coupled plasma state for 60 seconds. The discharge process occurs again for 120 seconds between the eleventh and twelfth steps.

A method for restoring an electrostatic chuck force embodying the present invention is useful for both bipolar and unipolar type chucks, and substantially eliminates or greatly reduces charges that have built up on an electrostatic chuck. A method embodying the invention is inexpensive, is not time consuming, and prevents a subsequent process step from becoming difficult to carry out due to a low chucking voltage or due to a high back side helium flow that results from residual charges in the chuck after previous process steps are finished.

A method embodying the invention for restoring an electrostatic chuck force may be carried out in-situ with the same apparatus used to process a semiconductor wafer between processing steps, or prior to moving a semiconductor wafer within a processing chamber toward a new processing station, or toward an unloading side.

The method as described above could also be applied between process steps that create complete semiconductor devices. In other words, the table in FIG. 3 could show the application of discharge steps between forming fourth and fifth semiconductor devices, between forming sixth and seventh semiconductor devices, and between forming eleventh and twelfth semiconductor devices.

The aforementioned method for restoring an electrostatic chuck force of the present invention has various advantages. For example, since the method of the present invention facilitates discharge of a charge in the chuck, in situ, by turning on only the source power, the method can shorten the fabrication cycle time period. Since a method embodying the present invention facilitates discharge of a charge as occasion demands, after a wafer fabricating process step is conducted, the method can be applied, as necessary, to prevent a drop of the electrostatic chucking force. Further, since the method does not require hardware or software modifications of an existing apparatus, the method is economical. Any polymer material deposited on the chuck can also be cleaned by controlling the source power to form a plasma at an appropriate level.

The foregoing embodiments are merely exemplary and are not to be construed as limiting the present invention. The present teaching can be readily applied to other types of apparatuses. Many alternatives, modifications, and variations will be apparent to those skilled in the art.

What is claimed is:

1. A method or restoring an electrostatic chuck force of an electrostatic chuck in a plasma apparatus, comprising the steps of
   a) supplying a source gas to the plasma apparatus; and
   b) applying a source power to the electrostatic chuck without applying a RF bias to induce a positive plasma.

2. The method of claim 1, wherein the step of applying source power to the electrostatic chuck comprises applying source power to one of a bipolar and a unipolar type chuck.

3. The method of claim 1, wherein the step of applying source power to an electrostatic chuck comprises applying source power to an electrostatic chuck in which a RF bias power and a source power can be independently controlled.

4. The method of claim 1, wherein steps (a) and (b) are performed between a succession of fabrication process steps while a substrate remains mounted on the plasma apparatus, and further comprising the step of repeating steps (a) and (b), as required, to ensure that an electrostatic chuck force remains sufficiently high to retain the substrate on the electrostatic chuck.

5. The method of claim 1, wherein the step of supplying a source gas comprises supplying a source gas selected from the group consisting of a gas identical to a gas used in a main fabrication process, an inert gas, and a gas effective for removal of polymers.

6. The method of claim 1, wherein the step of applying a source voltage comprises applying a source voltage for a time period that is shorter than a time period required for a main fabrication process step.

7. The method of claim 1, wherein accumulated charges in the electrostatic chuck are discharged under a 10 m torr pressure, in a 100 sccm $O_2$ flow, and at a 500 watt energy state.

8. A method of discharging an accumulated charge from an electrostatic chuck of a plasma apparatus, comprising the steps of:
   removing a RF bias from the electrostatic chuck when no substrate is mounted on the electrostatic chuck; and
   applying a source power to the electrostatic chuck when no substrate is mounted on the electrostatic chuck to discharge an accumulated charge from the electrostatic chuck.

9. The method of claim 8, further comprising the step of supplying a source gas to the plasma apparatus before applying the source power.

10. The method of claim 9, wherein the step of supplying a source gas comprises supplying the source gas at a pressure of approximately 10 m torr.

11. The method of claim 8, wherein the step of applying a source power comprises applying a source power of approximately 500 watts.

12. A method of fabricating a semiconductor device in a plasma apparatus, comprising the steps of:

holding a substrate in the plasma apparatus with a bipolar electrostatic chuck;

performing a processing step on the substrate;

applying a source power to the bipolar electrostatic chuck while no RF bias is applied to discharge an accumulated charge from the bipolar electrostatic chuck; and performing a subsequent processing step on the substrate after the accumulated charge has been discharged from the bipolar electrostatic chuck.

13. The method of claim 12, further comprising the step of supplying a source gas to the plasma apparatus.

14. The method of claim 13, wherein the step of supplying a source gas comprises supplying ore of a gas used in a processing step, an inert gas, and a gas capable of removing polymers to the plasma apparatus.

15. The method of claim 13, wherein the step of supplying a source gas comprises supplying a source gas at a pressure of approximately 10 m torr.

16. The method of claim 12, wherein the step of applying a source power to the plasma apparatus comprises applying a source power of approximately 500 watts.

17. The method of claim 12, wherein the step of applying a source power comprises applying a source power to the bipolar electrostatic chuck for a period of time that is smaller than a period of time during which a processing step occurs.

* * * * *